(12) United States Patent
Muramatsu et al.

(10) Patent No.: US 10,937,725 B2
(45) Date of Patent: Mar. 2, 2021

(54) SEMICONDUCTOR DEVICE AND METHOD FOR MANUFACTURING THEREOF

(71) Applicant: Mitsubishi Electric Corporation, Tokyo (JP)

(72) Inventors: Yuya Muramatsu, Tokyo (JP); Noriyuki Besshi, Tokyo (JP); Ryuichi Ishii, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/469,233

(22) PCT Filed: Dec. 26, 2017

(86) PCT No.: PCT/JP2017/046731
§ 371 (c)(1),
(2) Date: Jun. 13, 2019

(87) PCT Pub. No.: WO2018/131473
PCT Pub. Date: Jul. 19, 2018

(65) Prior Publication Data
US 2020/0105655 A1 Apr. 2, 2020

(30) Foreign Application Priority Data
Jan. 16, 2017 (JP) .............................. JP2017-005056

(51) Int. Cl.
*H01L 23/15* (2006.01)
*H01L 21/60* (2006.01)
*H01L 23/498* (2006.01)

(52) U.S. Cl.
CPC ........ *H01L 23/49838* (2013.01); *H01L 23/15* (2013.01); *H01L 2021/60015* (2013.01); *H01L 2021/6015* (2013.01)

(58) Field of Classification Search
CPC ............... H01L 23/49838; H01L 23/15; H01L 2021/60015; H01L 2021/6015;
(Continued)

(56) References Cited

U.S. PATENT DOCUMENTS

2015/0035132 A1 * 2/2015 Tanaka .............. H01L 23/49575
257/692

FOREIGN PATENT DOCUMENTS

| JP | H07130924 A | 5/1995 |
| JP | H1168035 A | 3/1999 |
| JP | 2016051878 A | 4/2016 |

OTHER PUBLICATIONS

International Search Report (PCT/ISA/210) and translation and Written Opinion (PCT/ISA/237) dated Mar. 13, 2018, by the Japan Patent Office as the International Searching Authority for International Application No. PCT/JP2017/046731.

* cited by examiner

*Primary Examiner* — Kyoung Lee
(74) *Attorney, Agent, or Firm* — Buchanan Ingersoll & Rooney PC

(57) ABSTRACT

A semiconductor device comprises: a ceramic substrate having conductor layers on both surfaces thereof; a semiconductor element joined to the upper surface conductor layer of the ceramic substrate; a frame member arranged on the upper surface conductor layer so as to surround a side surface of the semiconductor element; and an electrode, which is joined to an upper portion of the semiconductor element via a second fixing layer, and has fitting portions on a side surface of the electrode. On an inner wall of the frame member, fitting portions to be fitted to the fitting portions of the electrode and four positioning portions extending from the inner wall of the frame member to the side surfaces of the electrode are formed.

7 Claims, 9 Drawing Sheets

(58) Field of Classification Search
CPC ..... H01L 25/072; H01L 23/053; H01L 24/40;
H01L 24/32; H01L 2224/40998; H01L
2224/3701; H01L 2224/40499; H01L
2224/40101; H01L 2224/73215; H01L
2224/32014; H01L 2224/32058; H01L
2224/32057; H01L 2224/8384; H01L
2224/48229; H01L 2224/32227; H01L
2224/29; H01L 23/3735; H01L
2224/32225; H01L 2224/40137; H01L
23/48
See application file for complete search history.

SEMICONDUCTOR DEVICE AND METHOD FOR MANUFACTURING THEREOF

TECHNICAL FIELD

The present invention relates to a semiconductor device, and more particularly, to a semiconductor device in which an electrode is joined to a semiconductor element.

BACKGROUND ART

In recent years, semiconductor devices have been widely used not only for general industry use and electric railway use, but also for in-vehicle use. For in-vehicle use, particularly, when power semiconductor devices can be downsized and can have vibration resistance so as to be mounted near an engine or a transmission having particularly large vibration in a vehicle, a freedom of part layout in an engine room increases, thereby being capable of achieving downsizing of an entire vehicle. That is, the downsizing and enhancing the vibration resistance of the semiconductor devices are strongly required.

As described later in detail, in order to realize the downsizing of the semiconductor devices and the enhancing of the vibration resistance thereto, when an electrode is joined to the semiconductor element in the semiconductor device, a high mounting accuracy is required. In Patent Literature 1, there has been described an invention in which, in order to suppress the positional deviation, which occurs at the time of joining the plate-shaped electrode to the semiconductor element, the frame member is arranged so as to surround the semiconductor element joined to the ceramic substrate, the convex portions are formed on the inner wall of the frame member and the concave portions are formed in the side surfaces of the electrode, and the convex portions are fitted to the concave portions of the side surfaces of the electrode at the time of joining the electrode to the semiconductor element, to thereby suppress and minimize the positional deviation of the electrode.

CITATION LIST

Patent Literature

[PTL 1] JPA 2016-051878

SUMMARY OF INVENTION

Technical Problem

However, in the invention as described in Patent Literature 1, when jointing the electrode to the semiconductor device, the positional deviation is prevented by fitting the convex portions of the frame member to the concave portions of the side surfaces of the electrode. To prevent the positional deviation, however, it is required to form the concave portions of the electrode slightly larger than the convex portions of the frame member to provide a space for inserting the electrode into the frame member. For that reason, in the process of inserting the electrode into the frame member, the plate-shaped electrode may rotate in parallel to the upper surface of the semiconductor element to cause the positional deviation. Consequently, there is a fear in that the mounting accuracy may be decreased.

The present invention has been made in view of the above-mentioned circumstances, and an object of the present invention is to provide a semiconductor device capable of achieving a high mounting accuracy when an electrode is to be joined to a semiconductor element.

Solution to Problem

According to one embodiment of the present invention, there is provided a semiconductor device comprising: a ceramic substrate having conductor layers on both surfaces thereof; a semiconductor element joined to one of the conductor layers of the ceramic substrate; a frame member arranged on the one conductor layer so as to surround a side surface of the semiconductor element; and an electrode, which is joined to an upper portion of the semiconductor element via a fixing layer, and has a first fitting portion formed on a side surface of the electrode, wherein, on an inner wall of the frame member, a second fitting portion fitted to the first fitting portion of the electrode and a first positioning portion extending from the inner wall of the frame member to the side surface of the electrode are formed.

Advantageous Effects of Invention

According to one embodiment of the present invention, the semiconductor device capable of achieving a high mounting accuracy when the electrode is to be joined to the semiconductor element can be provided.

DESCRIPTION OF EMBODIMENTS

Now, embodiments of the semiconductor device of the present invention are described in detail with reference to the attached drawings. Note that, embodiments described hereinafter are merely an example, and the present invention is not limited by those embodiments.

First Embodiment

Figure 1:
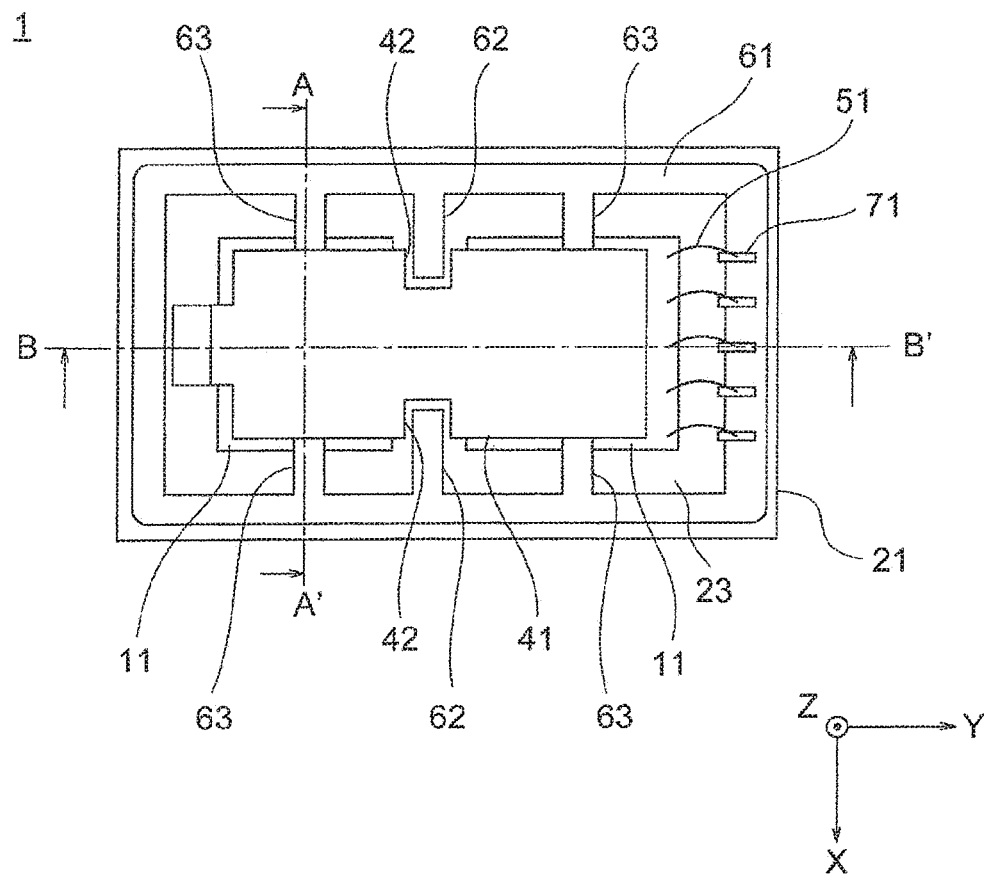
FIG. 1 is a top view of a semiconductor device according to a first embodiment of the present invention.
Figure 2:
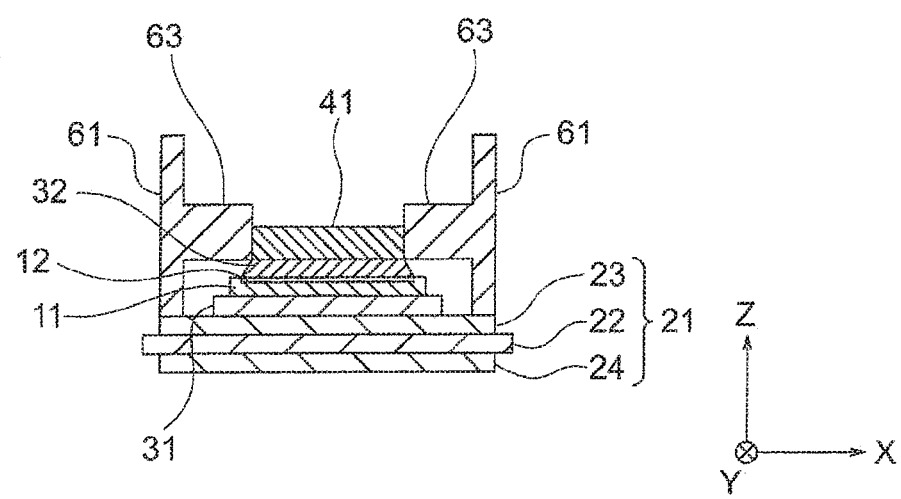
FIG. 2 is a sectional view taken along the line A-A' of FIG. 1.
Figure 3:
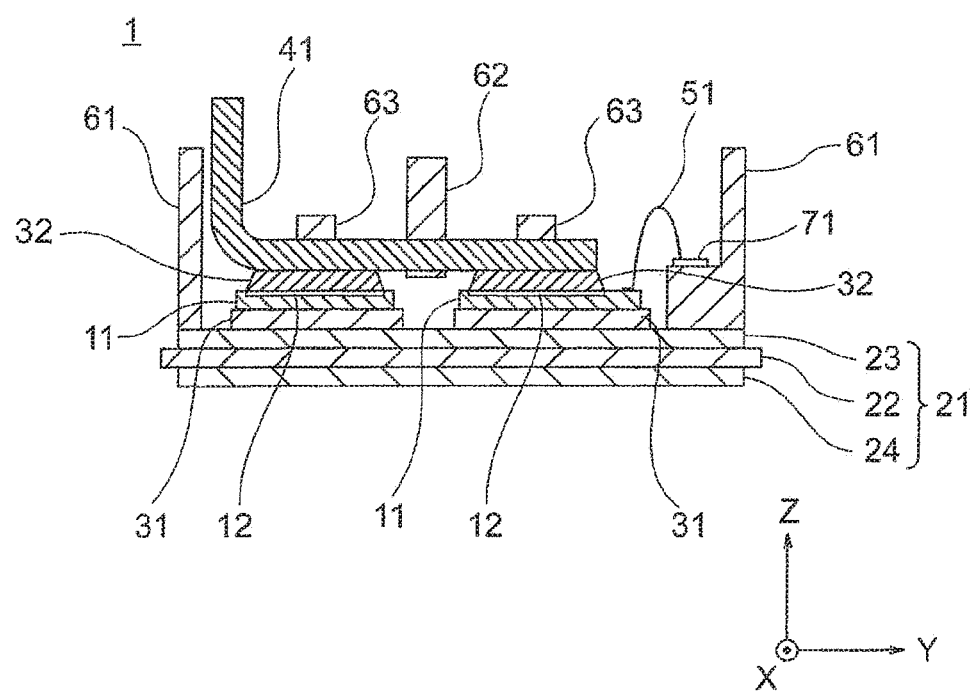
FIG. 3 is a sectional view taken along the line B-B' of FIG. 1.

FIG. 1 is a top view of a power semiconductor device 1 according to a first embodiment of the present invention. FIG. 2 is a sectional view taken along the line A-A' of FIG. 1, and FIG. 3 is a sectional view taken along the line B-B' of FIG. 1. In the following description, a positive direction of a Z-axis shown in each of FIG. 1 to FIG. 3 is defined as upward.

As illustrated in FIG. 1 to FIG. 3, power semiconductor elements 11 are placed on a ceramic substrate 21. More specifically, the ceramic substrate 21 comprises a ceramic layer 22, an upper surface conductor layer 23, and a lower surface conductor layer 24. The semiconductor elements are firmly fixed onto the upper surface conductor layer 23 of the ceramic substrate 21 via first fixing layers 31.

As a material of the ceramic layer 22, a material having insulating property and also having high thermal conductivity is preferably used, such as AlN, $Si_3N_4$, or $Al_2O_3$. Further, as a thickness of the ceramic layer 22, a ceramic layer having a thickness about from 0.3 mm to 1 mm is used for industrial uses.

As a material of the upper conductor layer 23 and the lower conductor layer 24, for example, Cu, Al, or a laminated body of Cu and Al is preferred. Further, as a thickness of the upper surface conductor layer 23 and the lower surface conductor layer 24, a surface conductor layer having a thickness about from 0.2 mm to about 1 mm is used for industrial uses. As the thicknesses of the upper conductor layer 23 and the lower conductor layer 24 become thicker, heat radiation from the semiconductor elements 11 becomes larger, but thermal stress to the ceramic layer 22 also becomes larger. Accordingly, in order to prevent breakage, it is required to secure a large margin of thickness, and hence the surface conductor layers having a thickness about 0.3 mm are often used practically.

The first fixing layers 31 are preferably a metal-based material, such as a solder, or a conductor material containing Ag or Cu, each having conductivity and allowing mechanical fixing. In particular, through use of a material, such as Ag having a high melting point, reliability of the first fixing layers 31 is increased when an operating temperature of the semiconductor elements 11 is raised.

As a material of the semiconductor elements 11, Si is generally used, but a material, such as GaN or SiC, capable of operating in high temperature may also be used. It is more preferred to use a material capable of such high temperature operation, because downsizing of the entire semiconductor device 1 can be achieved.

Further, a plate-shaped electrode 41 for a main circuit is mounted on the upper surface of the upper surface conductor layer 23 and the semiconductor elements 11. More specifically, the electrode 41 is joined to the semiconductor element 11s via second fixing layers 32. As illustrated in FIG. 3, one end of the electrode 41 is exposed upward of the semiconductor device 1.

As a material of the electrode 41, preferably a material, such as Cu or a Cu alloy, having high electric conductivity and being easily used industrially. Further, the electrode 41 also serves to diffuse heat generated on the surface of the semiconductor elements 11 to an outside, and hence the electrode 41 is required to have high thermal conductivity. For that reason, Cu is particularly preferably used.

As a thickness of the electrode 41, a metal material having a thickness of from about 0.2 mm to 1 mm is used. As the thickness becomes larger, thermal stress to the semiconductor elements 11 becomes larger, whereas, as the thickness becomes too thinner, there may cause a problem of resistance heating due to electric resistance at the time of energization. Consequently, it is required to select an appropriate thickness. Further, as occasion demands, it is also effective to lower its apparent rigidity by forming holes for stress reduction to reduce the heat stress.

As a material of the second fixing layers 32, a material having conductivity, such as a solder, Ag, Cu, or a CuSn alloy, is preferably used. Further, the second fixing layers 32 are configured to directly come in contact with the semiconductor elements 11, and hence the second fixing layers 32 preferably have a high melting point. This is because such a nature that, when a metal is used at a temperature of a recrystallization temperature or more, a crystal grain boundary moves due to diffusion, crystal grains become coarse, and the second fixing layers 32 become weaker against metal fatigue. For that reason, from the viewpoint of long-term reliability, for example, an Ag sintering material, a Cu sintering material, or a CnSn sintering material having a low melting point at a time of joining but having a melting point raised during joining, is preferably used.

Further, when a particularly high reliability is required for joint portions between the electrode 41 and the semiconductor elements 11, it is effective that not only using Cu for the material of the electrode 41, but also making a linear expansion coefficient of the electrode 41 closer to a linear expansion coefficient of the semiconductor elements 11 (for example, 2.5 ppm/K for silicon).

For example, when the electrode 41 is formed of a cladding material in which Cu, Invar (Fe—36% Ni alloy) and Cu are laminated into three layers, it is possible to control the apparent linear expansion coefficient of the electrode 41 relative to a thickness ratio thereof. When a ratio of Invar is increased, the ratio of 4 ppm/K (Cu:Invar:Cu=1:8:1) is determined, and when the ratio of Invar is decreased, the ratio of 13 ppm/K (Cu:Invar:Cu=2:1:2) is determined. Thus, the apparent linear expansion coefficient of the electrode 41 can freely be changed between silicon (2.5 ppm/K) and copper (17 ppm/K).

From the description above, when reduction of a difference between the linear expansion coefficients of the electrode 41 and the semiconductor elements 11 is conducted, a distortion amount of the second fixing layers 32 arranged therebetween is reduced, with the result that the reliability of the joint portions between the electrode 41 and the semiconductor elements 11 can be enhanced.

Further, a frame member 61 is arranged on the upper surface conductor layer 23 so as to surround the semiconductor elements 11. On the inner wall of the frame member 61, fitting portions (second fitting portions) 62 are formed at positions facing to each other. Further, on the side surfaces of the electrode 41, fitting portions (first fitting portions) 42 are formed at positions corresponding to the fitting portions 62 of the frame member 61. Still further, on the inner wall of the frame member 61, four positioning portions (first positioning portions) 63 are formed so as to extend from the inner wall of the frame member 61 to the side surfaces of the electrode 41. In order to form such a shape, it is preferred that the electrode 41 be subjected to machining such as punching.

When the electrode 41 is joined to the semiconductor elements 11, the electrode 41 is inserted into an area inside the frame member 61, and is then pushed downward. At the pushing, the fitting portions 42 of the electrode 41 are fitted to the fitting portions 62 of the frame member 61, and the side surfaces of the electrode 41 are inserted into the area defined by each end of the four positioning portions 63 of the frame member 61. That is, the frame member 61 plays a role of a positioning guide for the electrode 41.

Further, a bottom portion of one side of the frame member 61 protrudes inward, and a terminal block 71 is arranged on this portion. The semiconductor elements 11 are electrically connected to the terminal block 71 by signal lines 51 made of Al, Cu, Au, or the like.

As a material of the frame member 61, a resin material, which can be subjected to injection-molding, and has high heat resistance, is preferably used. For example, a polyphenylene sulfide (PPS), a liquid crystal resin, a fluorine-based resin or the like are particularly preferred. As a method of fixing the frame member 61, a soft adhesive, such as silicones is preferably used. Further, although not illustrated in FIG. 1 to FIG. 3, a sealing resin is to be injected inside the frame member 61, and the electrode 41 and the semiconductor elements 11 are sealed with resin.

Next, an action of the semiconductor device 1 according to the first embodiment of the present invention is described.

As one application example of the semiconductor device 1 according to the present invention, there is conceived an inverter for driving an in-vehicle motor or the like. When the motor is driving, a current of several hundred amperes generally flows, and hence, based on a temperature change in association with increase or decrease in load of the motor, distortion due to thermal stress occurs at the joint portions (the first fixing layers 31 and the second fixing layers 32) inside the semiconductor device 1. At this time, in order to prevent the joint portions from being deteriorated to be damaged due to repeated temperature changes, it is required to reduce the distortion due to the thermal stress generated in the joint portions.

In general, the distortion due to the thermal stress becomes maximum at a point in which the difference between the linear expansion coefficients of the materials is large. For example, around the second fixing layers 32, the difference in linear expansion coefficient between the second fixing layers 32 and the semiconductor elements 11 is larger than that between the electrode 41 and the second fixing layers 32. Further, a magnitude of distortion is also influenced by a shape of end portions of the second fixing layers 32.

Figure 4A:
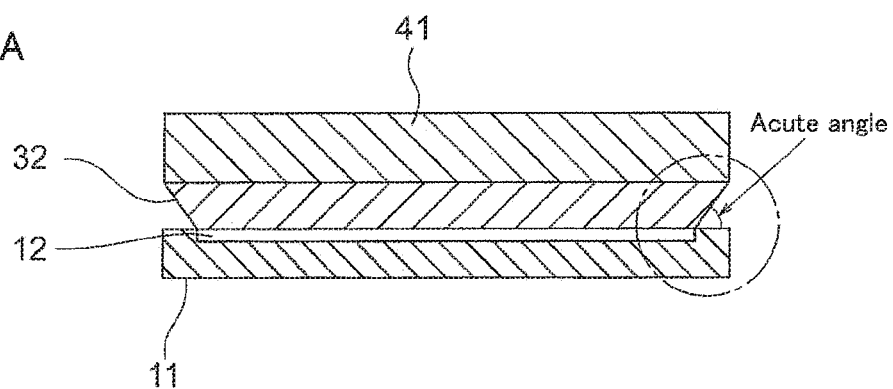
FIGS. 4A and 4B are views for illustrating two examples of a shape of end portions of a second fixing layer in the semiconductor device according to the first embodiment of the present invention.
Figure 4B:
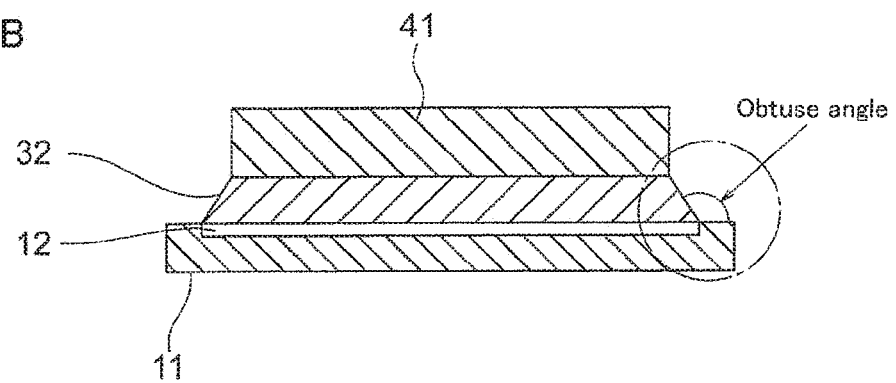

In FIG. 4, two examples of the shapes of the end portions of the second fixing layer 32 are illustrated. As illustrated in FIG. 4A, when the end portions of the second fixing layer 32 are formed to have an acute angle with respect to the fixing surface 12 of the semiconductor element 11, the distortion increases. Meanwhile, as illustrated in FIG. 4B, when the end portions of the second fixing layer 32 are formed to have an obtuse angle with respect to the fixing surface 12 of the semiconductor element 11, the distortion reduces. That is, in order to reduce the distortion due to thermal stress, it is important that the shapes of the end portions of the second fixing layer 32 have an obtuse angle as illustrated in FIG. 4B.

In order to form the shapes of the end portions of the second fixing layer 32 as being intended, it is important to prevent a positional deviation from occurring when the electrode 41 is to be joined to the semiconductor element 11 via the second fixing layer 32. As described above, in Patent Literature 1, the concave portions on the side surfaces of the electrode are fitted to the convex portions of the frame member to prevent the positional deviation from occurring when the electrode is to be joined to the semiconductor element via the fixing layer. However, for that purpose, it is required to form the concave portions of the electrode slightly larger than the convex portions of the frame member so as to provide spaces for inserting the electrode into the frame member. For that reason, in the process of inserting the electrode into the frame member, the plate-shaped electrode may rotate in parallel to the upper surface of the semiconductor element, and hence the deviation occurs. Accordingly, there is a fear in that the shapes of the end portions of the fixing layer cannot be formed to have an intended obtuse angle.

In contrast, in the semiconductor device 1 according to the first embodiment of the present invention, the fitting portions 42 of the electrode 41 are formed. Also, on the inner wall of the frame member 61, the fitting portions 62 to be fitted to the fitting portions 42 of the electrode 41 and the four positioning portions 63 extending from the inner wall of the frame member 61 to the side surfaces of the electrode 41 are formed. Thus, in the process of inserting the electrode 41 into the frame member 61, the four positioning portions 63 prevent the rotation of the electrode 41. As a result, high mounting accuracy can be achieved when the electrode 41 is to be joined to the semiconductor elements 11 via the second fixing layers 32.

Figure 5:
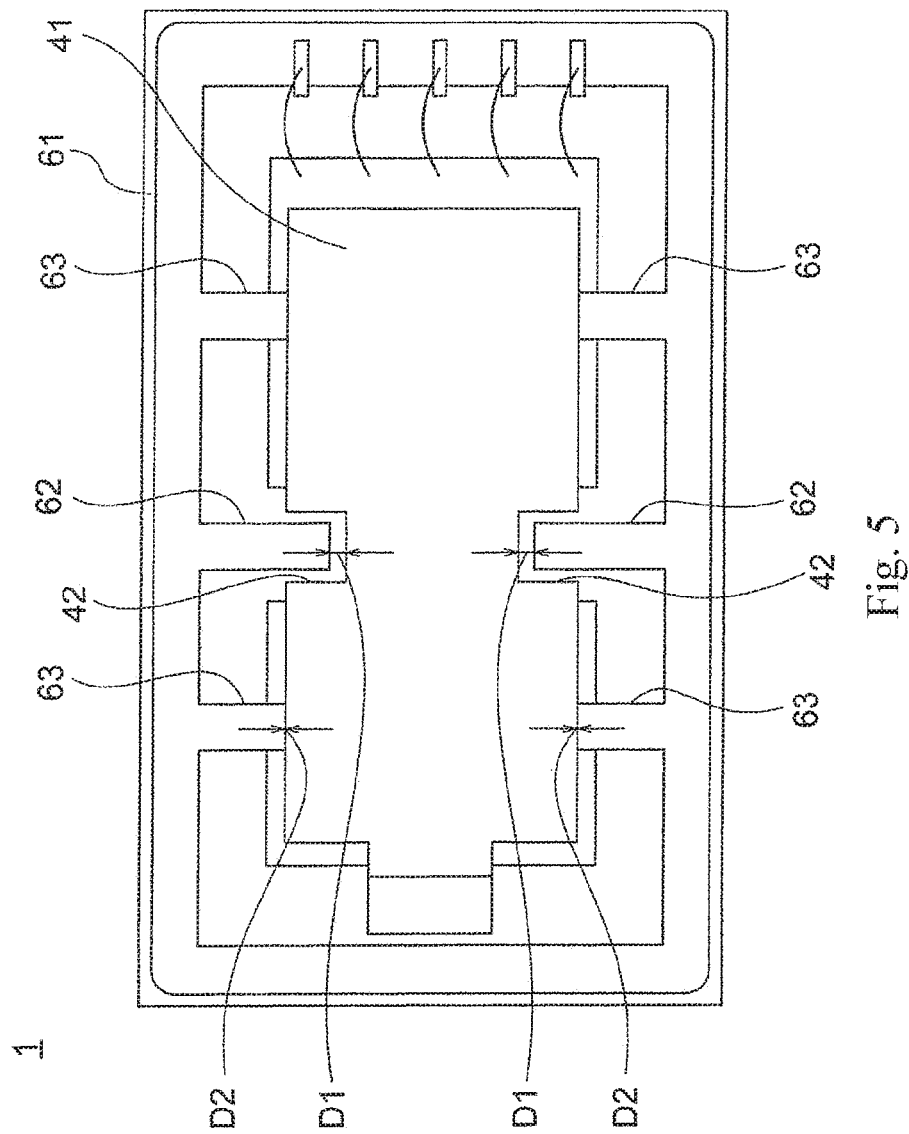
FIG. 5 is a view for illustrating details of spaces between a frame member and electrodes in the semiconductor device according to the first embodiment of the present invention.

Further, as illustrated in FIG. 5, spaces D2 between the positioning portions 63 of the frame member 61 and the side surfaces of the electrode 41 are set to be smaller than spaces D1 between the fitting portions 62 of the frame member 61 and the fitting portions 42 of the electrode 41. As a result, the mounting accuracy of the electrode 41 can be further enhanced. The spaces D1 and D2 are spaces which contribute to the positioning of the electrode 41 in an X-direction in the frame member 61.

Further, when the spaces between the electrode 41 and the fitting portions 62 of the frame member 61 and between the electrode 41 and the positioning portions 63 of the frame member 61 are only simply made smaller, there is a fear in that workability at the time of inserting the electrode 41 into the frame member 61 becomes poorer. To cope with this, as illustrated in FIG. 3, the heights of the fitting portions 62 of the frame member 61 are set to be higher than the heights of the positioning portions 63 of the frame member 61. The fitting portions 42 of the electrode 41 are fitted to the fitting portions 62 of the frame member 61 in advance, and then the side surfaces of the electrode 41 are inserted into the area formed by each end of the four positioning portions 63 of the frame member 61. With this structure, the deterioration of workability at the time of inserting the electrode 41 into the frame member 61 is prevented.

Further, the heights of the fitting portions 62 of the frame member 61 are preferably higher than that of upper ends of the signal lines 51. With this structure, the electrode 41 can be inserted into the frame member 61 without touching the easily deformable signal wires 51.

Further, the heights of the positioning portions 63 of the frame member 61 are preferably at least the same level as that of the upper surface of the electrode 41, and it is more preferred that the positioning portions 63 of the frame member 61 be higher than the upper surface of the electrode 41 by about the thickness level of the electrode 41. With this structure, it is possible to prevent the electrode 41 from riding on the positioning portion 63 of the frame member 61 due to vibration or the like during conveyance, and from causing connection failure.

In the above-mentioned example, the four positioning portions 63 are formed on the frame member 61. However, in order to prevent the rotation of the electrode 41, it is preferred that at least two positioning portions 63 be formed in different areas among four areas of the frame member 61, which are divided by longitudinal and transverse center lines of the electrode 41. However, when two positioning portions 63 are formed in the areas to be diagonal among the four areas described above, it is only possible to prevent the rotation in one direction, so it is not preferred to form the positioning portions 63 in this manner.

Figure 6:
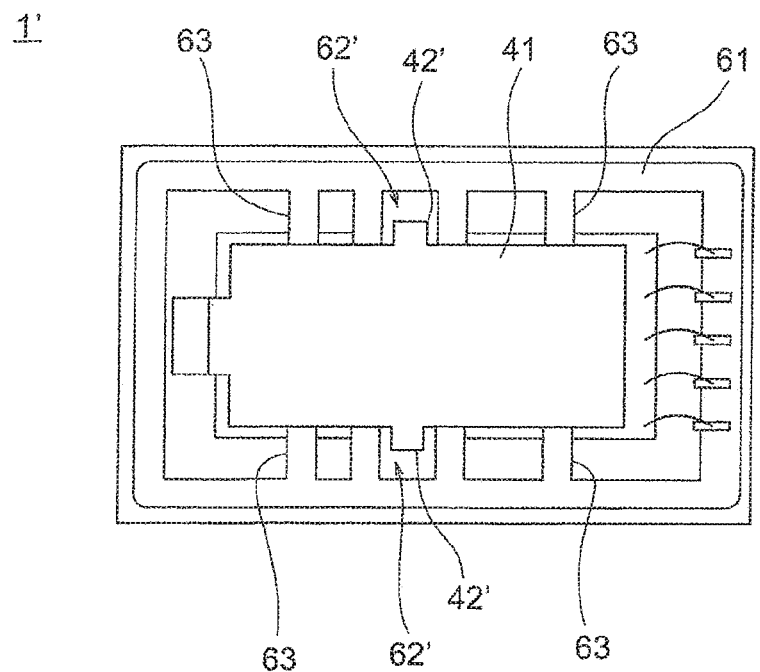
FIG. 6 is a top view of a semiconductor device according to a modification example of the first embodiment of the present invention.

Further, in order to exhibit an effect of the present invention, as illustrated in FIG. 6, the concave-convex relationship between the electrode 41 and the frame member 61 can be reversed such that fitting portions 42' are formed on the electrode 41 and fitting portions 62' are formed in the frame member 61.

Further, the fitting portions 62 and the positioning portions 63 of the frame member 61 may be tapered. With the tapered shape, workability at the time of inserting the electrode 41 into the frame member 61 is further improved.

Figure 7:
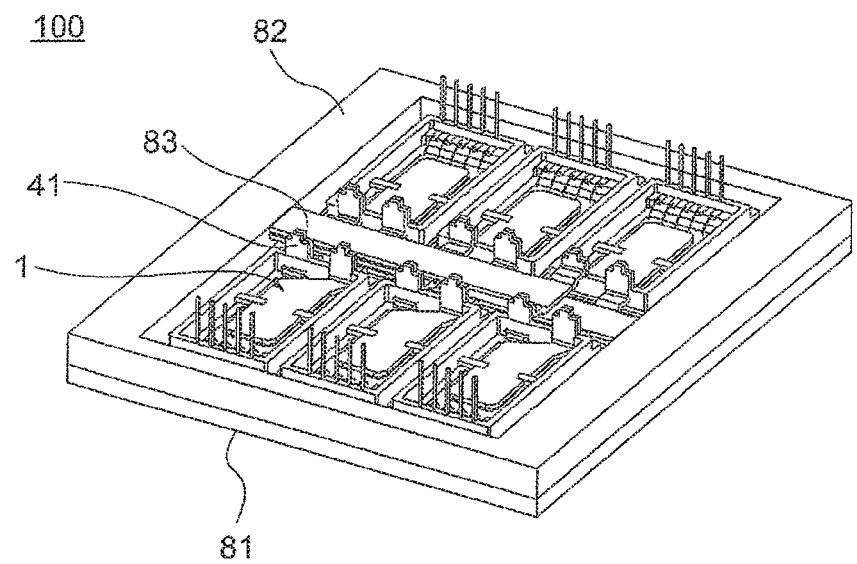
FIG. 7 is a perspective view of a semiconductor system configured to have a plurality of modularized semiconductor devices according to the first embodiment of the present invention.

FIG. 7 is a perspective view of a semiconductor system 100 configured by a plurality of modularized semiconductor devices 1 according to the first embodiment of the present invention.

In the semiconductor system 100, six semiconductor devices 1 are placed on a plate-shaped heat radiation member 81. More specifically, the lower surface conductor layer 24 of the ceramic substrate 21 of each semiconductor device 1 is joined to the heat radiation member 81 via a third fixing layer (not shown).

As a material of the heat radiation member 81, a material having high heat conductivity, such as Al, Cu, a CuMo alloy, or SiCAL, is preferably used. Further, when a difference in linear expansion coefficient between the ceramic substrates 21, on which the semiconductor elements 11 are placed, and the heat radiation member 81 is large, it becomes difficult to ensure durability of the third fixing layer. In order to ensure high durability, a material having a low linear expansion coefficient, such as a CuMo alloy or SiCAl, is particularly preferred.

As a material of the third fixing layer, a material having high heat radiation property and little deterioration over a long period is preferred. However, in terms of temperature, a distance from the semiconductor elements 11 is large, and hence a solder or the like can sufficiently withstand practical use. Of course, Ag sintering material, Cu sintering material, CuSn sintering material or the like having durability at high temperature can also be used.

Further, an outer frame member 82 is arranged on the heat radiation member 81, for surrounding the frame members 61 of the semiconductor devices 1. Further, an external electrode 83 to be used in common with each semiconductor device 1 is joined to an inner wall of the outer frame member 82. Portions exposed above the electrodes 41 of the semiconductor devices 1 are electrically and mechanically connected to the external electrode 83.

As described above, a semiconductor device mounted in a vehicle is required to have high vibration resistance. In particular, joint portions between the electrodes 41 of the semiconductor devices 1 and the external electrode 83 are the portions at which the highest vibration resistance is required. As a method of providing high vibration resistance at the joint portions between the electrodes 41 and the external electrode 83, a method of screwing the joint portions, a method of welding the joint portions for integration, and the like are conceivable. However, in the method of screwing the joint portions, it is required to secure spaces for seating surfaces of nuts, and there is a fear in that downsizing of the semiconductor system 100 is hindered.

Meanwhile, in the method of joining the electrodes 41 to the external electrode 83 by TIG welding for integration, if interference of chuck parts at the time of welding can be prevented, the downsizing of the semiconductor system 100 becomes possible compared to the screwing method. Further, if a method indirectly transmitting energy to welded portions for laser welding, or the like can be adopted, further downsizing of the semiconductor system 100 may be available.

In a case in which the electrodes 41 and the external electrode 83 are integrated by TIG welding to enhance the vibration resistance, if a close contact state between the electrodes cannot be maintained at the time of welding, each element would be welded separately and excellent joining property cannot be obtained. As a method of bringing each electrode 41 and the external electrode 83 into close contact with each other, it is common to weld while the two electrodes are chucked and a distance therebetween is shortened.

However, as a correction amount increases, external stress is applied to the second fixing layers 32 at a base of the electrodes 41 and the semiconductor elements 11, and hence it is required to sufficiently suppress the correction amount. In order to suppress this correction amount, it is important to improve mounting accuracy of the electrodes 41 of the semiconductor devices 1. As described above, in the present invention, the mounting accuracy of the electrodes 41 of the semiconductor devices 1 is enhanced, and hence the correction amount of the electrodes 41 can be suppressed at the time of welding.

Figure 8:
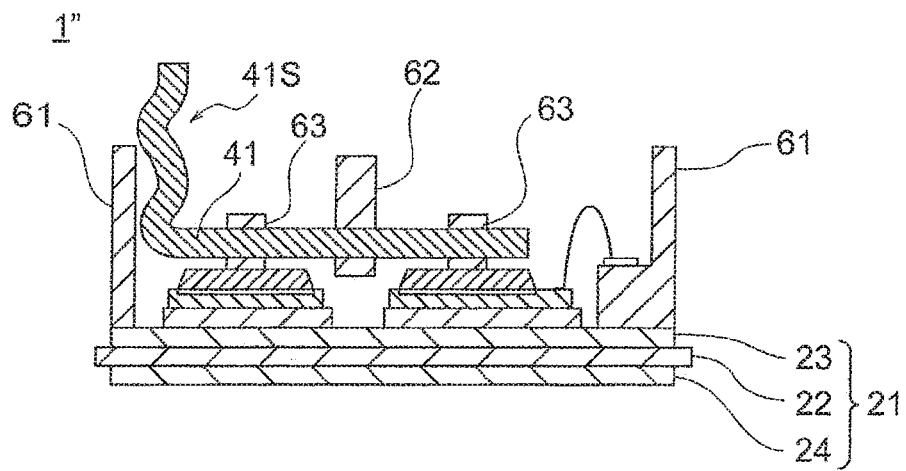
FIG. 8 is a sectional view of a semiconductor device according to another modification example of the first embodiment of the present invention.

In order to achieve further higher vibration resistance, it is preferred to increase a radius R of a rising portion of the electrode 41 of each semiconductor device 1 to largely secure a stress relief for relieving expansion and contraction, or vibration. Further, as illustrated in FIG. 8, at a vertical portion of each electrode 41, an S-shaped vent 41S may be formed to secure a stress relief.

Further, if the frame member 61 and the electrodes 41 of the semiconductor devices 1 are fixed too firmly, the stress applied to the electrodes 41 cannot be relieved, with the result that the frame members 61 would be preferably slightly deformable. To cope with this, it is preferred that the frame members 61 be made of a PPS, a liquid crystal resin, a fluorine-based resin, or the like as described above, and that the thickness thereof be about 1 mm or less.

Second Embodiment

Next, a semiconductor device 201 according to a second embodiment of the present invention is described. When a material of the second fixing layers 32 of the semiconductor device 1 according to the first embodiment is made of solder, as a method of supplying the solder, there are exemplified a method of using paste-like solder and a method of using plate-shaped solder.

The paste-like solder contains a flux component having a reducing action, thereby being easily supplied. However, the flux component generates voids at the time of the joining, to thereby deteriorate heat radiation. Further, the flux component contaminates surrounding therearound, and hence washing is required after the joining.

Meanwhile, the plate-shaped solder requires the positioning after being supplied and the joining under a reducing atmosphere. However, the plate-shaped solder does not contain the flux component, thereby being less generation of voids, and less contamination to the surrounding. For that reason, in order to enhance the quality of the semiconductor device 1, it is preferred to use the plate-shaped solder.

When the plate-shaped solder is used to join the electrode 41 to the semiconductor elements 11, the plate-shaped solder is previously arranged on bottom surfaces of the electrode 41, and is plastically deformed by pressing with a press machine, or the like, to be fixed to the electrode 41. Then, the solder is heated and melted to join the electrode 41 to the semiconductor elements 11. Note that, a method of positioning the solder with a jig is inappropriate because it is difficult to prevent the jig from coming contact with the semiconductor elements 11, and to mount and remove the jig.

Further, the shapes of the end portions of each second fixing layer 32 are also influenced by a size relationship between an area of each bottom surface of the electrode 41 and an area of the fixing surface 12 of each semiconductor element 11. In order to form the end portions of the second fixing layer 32 on each semiconductor element 11 side, which has a larger difference in linear expansion coefficient, to have an obtuse angle, it is preferred that the area of the fixing surface 12 of each semiconductor element 11 be larger than the area of each bottom surface of the electrode 41. Note that, the bottom surfaces of the electrode 41 indicate portions at which the fixing layers 32 are joined to the electrode 41.

Figure 9:
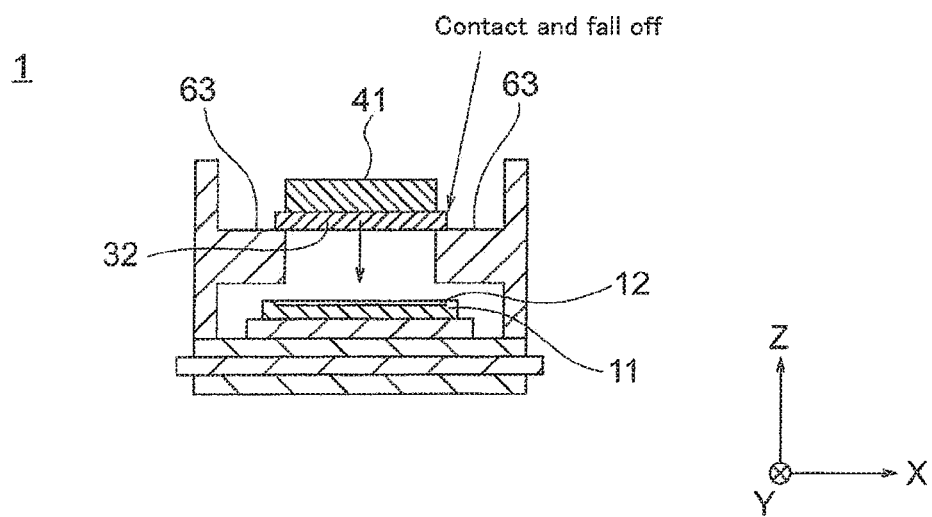
FIG. 9 is a sectional view of the semiconductor device according to the first embodiment of the present invention.

However, if the area of the fixing surface 12 of each semiconductor element 11 is simply made larger than the area of each bottom surface of the electrode 41, the plate-shaped solder having an area equivalent to the area of the fixing surface 12 of each semiconductor element 11 is required, and hence the area of the plate-shaped solder becomes larger than the area of each bottom surface of the electrode 41. As a result, as illustrated in FIG. 9, in the process of inserting the electrode 41 into the frame member 61, the plate-shaped solder 32 comes into contact with the positioning portions 63 of the frame member 61 and falls off.

Figure 10:
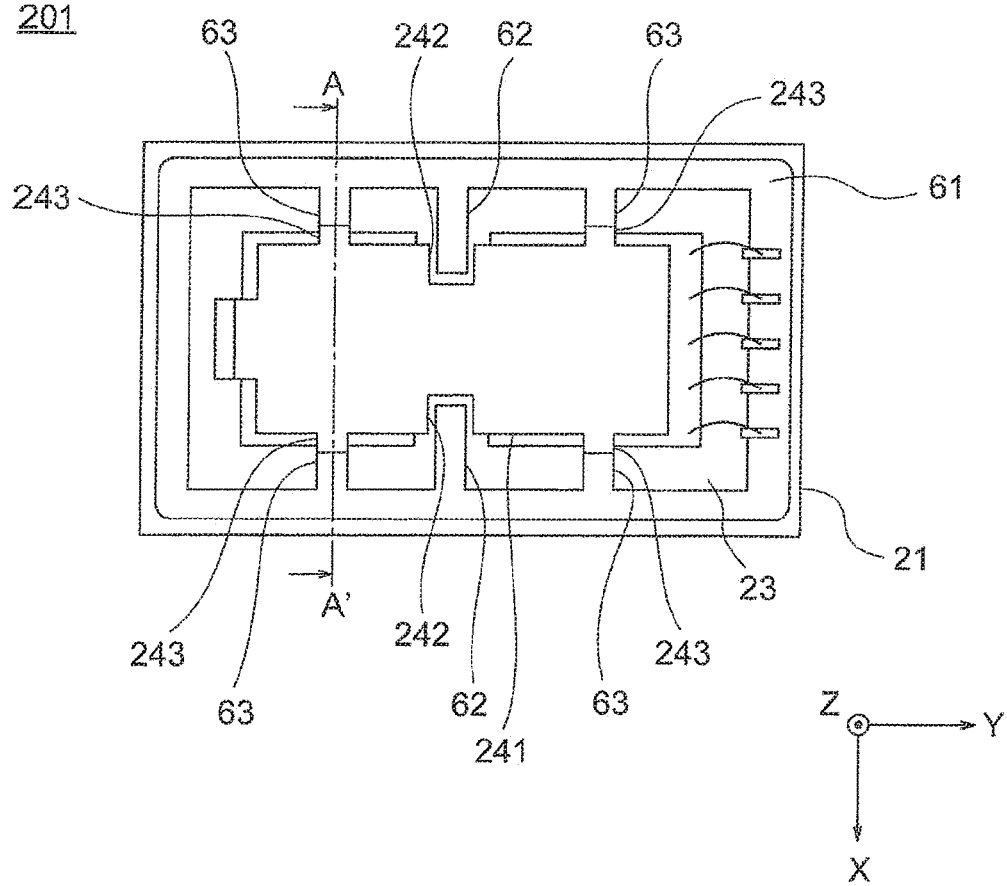
FIG. 10 is a top view of a semiconductor device according to a second embodiment of the present invention.
Figure 11:
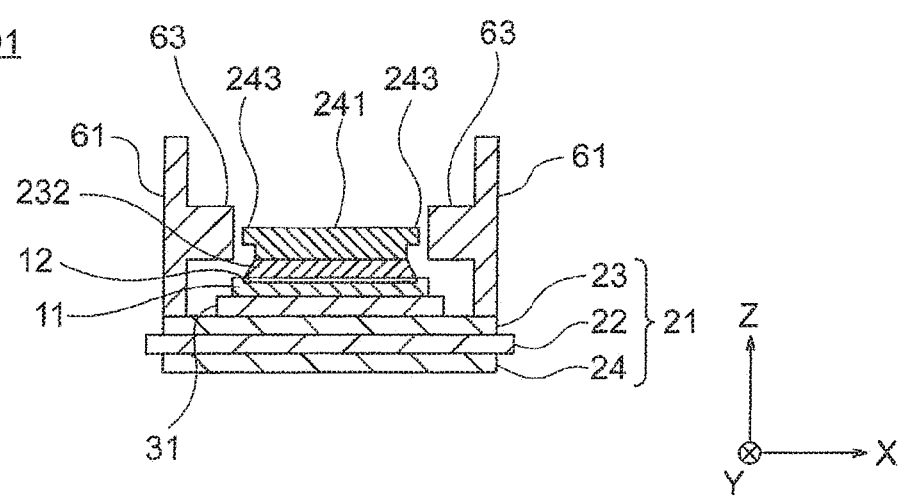
FIG. 11 is a sectional view taken along the line A-A' of FIG. 10.

The semiconductor device 201 according to the second embodiment of the present invention is intended to solve such a problem. FIG. 10 is a top view of the power semiconductor device 201 according to the second embodiment of the present invention. Further, FIG. 11 is a sectional view taken along the line A-A' of FIG. 10. In the following description, a positive direction of the Z-axis shown in each of FIG. 10 and FIG. 11 is defined as upward. Further, each of a "width" of the electrode 241 and the semiconductor elements 11 indicates a length in an X-axis direction.

As illustrated in FIG. 10 and FIG. 11, on the side surfaces of the electrode 241, four positioning portions (second positioning portions) 243 are formed at positions corresponding to the four positioning portions 63 of the frame member 61. With this structure, the width of the fixing surface 12 of each semiconductor element 11 becomes larger than the width of each bottom surface of the electrode 241 so that the plate-shaped solder arranged on each bottom surface of the electrode 241 is positioned on a more inner side than the positioning portions 63 of the frame member 61. As a result, as illustrated in FIG. 12, in the process of inserting the electrode 241 into the frame member 61, it is possible to set the shapes of the end portions of the second fixing layer 232 on each semiconductor element 11 side to have an obtuse angle while the plate-shaped solder 232 is prevented from coming in contact with the positioning portions 63 of the frame member 61 and from falling off.

It is preferred that the fitting portions 62 of the frame member 61 and the fitting portions 242 of the electrode 241 be arranged between the two semiconductor elements 11. If the fitting portions 62 of the frame member 61 and the fitting portions 242 of the electrode 241 are provided at any positions on sides of the semiconductor elements 11, the fitting portions 242 of the electrode 241 are required to serve for the positioning in a Y-direction and for preventing the plate-shaped solder 232 from coming in contact with the fitting portions 62 of the frame member 61. As a result, compared to the case in which the fitting portions 62 of the frame member 61 and the fitting portions 242 of the electrode 241 are arranged between the two semiconductor elements 11, the fitting portions 242 of the electrode 241 are required to be elongated in the X-direction. In this case, an area of a base material required for punching the electrode 241 increases, resulting in cost increase.

Figure 12:
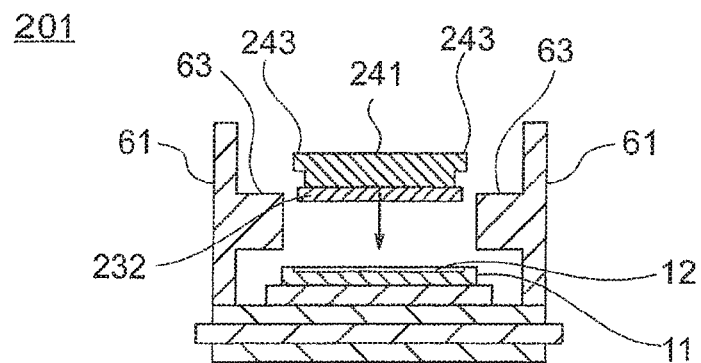
FIG. 12 is a sectional view of the semiconductor device according to the second embodiment of the present invention.

Further, as illustrated in FIG. 12, it is preferred that the positioning portions 243 of the electrode 241 be formed only at upper portions of the side surfaces of the electrode 241. With such a structure, the width of bottom surface of the electrode 241 is the same with the width thereof even at the positions of the positioning portions 243, with the result that each of the shapes of the end portions of the second fixing layers 242 in those portions can also have an obtuse angle.

Third Embodiment

Figure 13:
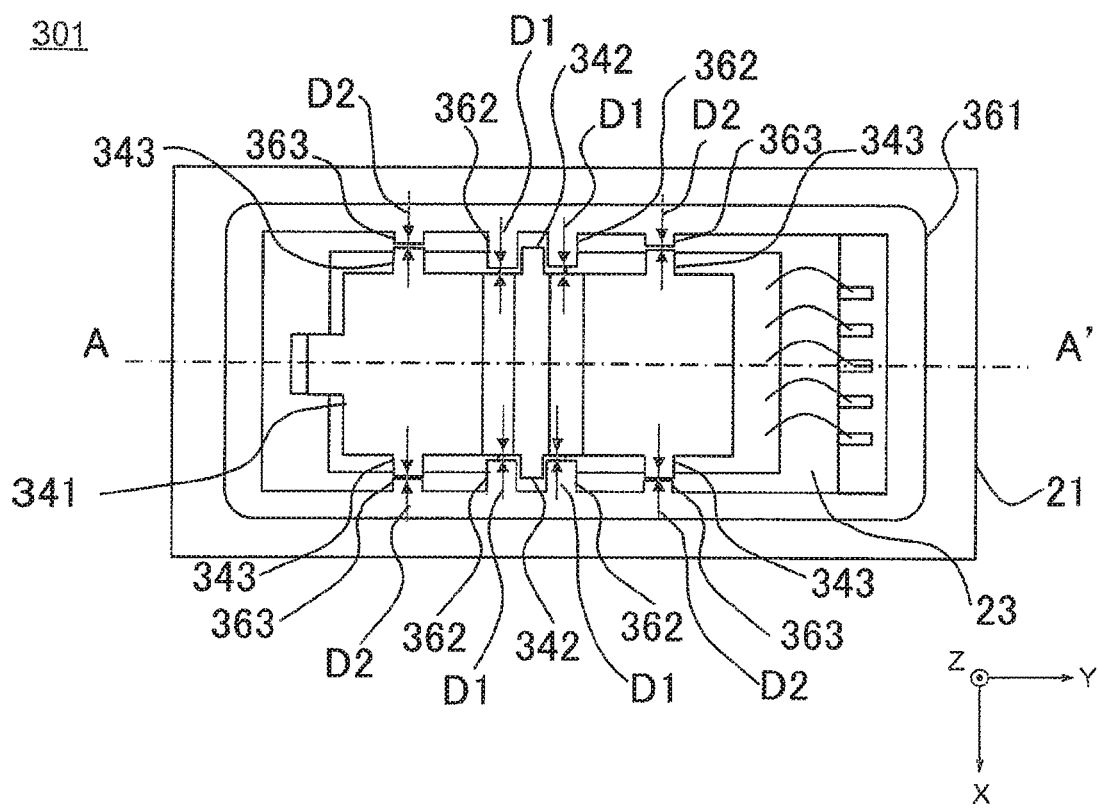
FIG. 13 is a top view of a semiconductor device according to a third embodiment of the present invention.
Figure 14:
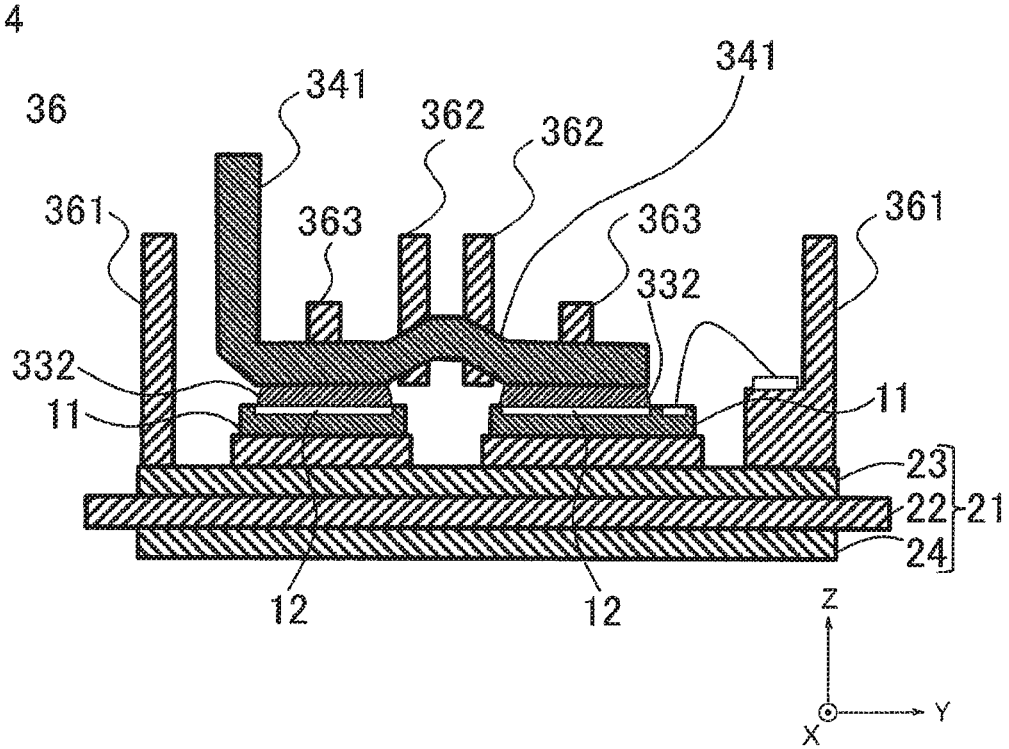
FIG. 14 is a sectional view taken along the line A-A' of FIG. 13.

Next, a semiconductor device 301 according to a third embodiment of the present invention is described. FIG. 13 is a top view of the power semiconductor device 301 according to the third embodiment of the present invention. Further, FIG. 14 is a sectional view taken along the line A-A' of FIG. 13. Note that, in the following description, a positive direction of the Z-axis shown in each of FIG. 13 and FIG. 14 is defined as upward.

As illustrated in FIG. 13 and FIG. 14, in the semiconductor device 301, a portion of an electrode 341, which is not located right above the fixing surfaces 12 of the semiconductor elements 11, is bent upward. With this structure, the area of each bottom surface of the electrode 341 can be made smaller than the area of the fixing surface 12 of each semiconductor element 11, thereby being capable of setting each of the shapes of the end portions of the second fixing layer 332 on each semiconductor element 11 side to have an obtuse angle.

In a case of the shape of the third embodiment, it is preferred that each of the fitting portions 362 of the frame member 361 have a concave shape, and that each of the fitting portions 342 of the electrode 341 have a convex shape. In a case in which an interval between the two semiconductor elements 11 is narrow, if each of the fitting portions 342 of the electrode 341 has a concave shape, a portion of an oblique shape formed by bending the electrode 341 turns to have a concave shape, and dimensional accuracy of the electrode 341 is liable to be deteriorated. Contrary to this, if each of the fitting portions 342 of the electrode 341 has a convex shape, it is possible to prevent deterioration of the dimensional accuracy by forming the portion of the electrode 342 to be a crest into a convex shape.

Further, as similar to FIG. 12 of the second embodiment, it is preferred that the positioning portions 343 of the electrode 341 be formed only at the upper portions of the side surfaces of the electrode 341. With such a structure, the width of the bottom surface of the electrode 341 is the same with the width thereof even at the positions of the positioning portions 343, with the result that each of the shapes of the end portions of the second fixing layers 342 in those portions can also have an obtuse angle.

The invention claimed is:

1. A semiconductor device comprising:
   a ceramic substrate having conductor layers on both surfaces thereof;
   a semiconductor element joined to one of the conductor layers of the ceramic substrate;
   a frame member arranged on the one conductor layer so as to surround a side surface of the semiconductor element; and
   an electrode, which is joined to an upper portion of the semiconductor element via a fixing layer, and has a first fitting portion formed on a side surface of the electrode,
   wherein, on an inner wall of the frame member, a second fitting portion fitted to the first fitting portion of the electrode and a first positioning portion extending from the inner wall of the frame member to the side surface of the electrode are formed.

2. The semiconductor device according to claim 1, wherein a space between the first positioning portion of the frame member and the side surface of the electrode is formed to be smaller than a space between the second fitting portion of the frame member and the first fitting portion of the electrode.

3. The semiconductor device according to claim 1, wherein a height of the second fitting portion of the frame member is formed to be higher than a height of the first positioning portion.

4. The semiconductor device according claim 1, wherein a second positioning portion is formed, at a position corresponding to the first positioning portion of the frame member, on the side surface of the electrode, and a width of a fixing surface of the semiconductor element is larger than a width of a bottom surface of the electrode.

5. The semiconductor device according to claim 4, wherein the second positioning portion of the electrode is formed only at an upper portion of the side surface of the electrode.

6. The semiconductor device according claim 1, wherein a portion of the electrode, which is not located right above a fixing surface of the semiconductor element, is bent upward, and an area of the fixing surface of the semiconductor element is larger than an area of a bottom surface of the electrode.

7. A method for manufacturing a semiconductor device including a ceramic substrate having conductor layers on both surfaces thereof, a semiconductor element joined to one of the conductor layers of the ceramic substrate, a frame member arranged on the one conductor layer so as to surround a side surface of the semiconductor element, and an electrode, which is joined to an upper portion of the semiconductor element via a fixing layer, and has a first fitting portion formed on a side surface of the electrode, wherein, on an inner wall of the frame member, a second fitting portion fitted to the first fitting portion of the electrode and a first positioning portion extending from the inner wall of the frame member to the side surface of the electrode are formed, wherein a second positioning portion is formed, at a position corresponding to the first positioning portion of the frame member, on the side surface of the electrode, and a width of a fixing surface of the semiconductor element is larger than a width of a bottom surface of the electrode, the method comprises the steps of:
   arranging a plate-shaped solder, as the fixing layer, on the bottom surface of the electrode,
   pressing the plate-shaped solder to be plastically deformed so as to fix the plate-shaped solder onto the bottom surface of the electrode, and
   heating the plate-shaped solder to melt so as to join the bottom surface of the electrode to the fixing surface of the semiconductor element.

* * * * *